United States Patent
Yang et al.

[11] Patent Number: 5,856,232
[45] Date of Patent: Jan. 5, 1999

[54] METHOD FOR FABRICATING T-SHAPED ELECTRODE AND METAL LAYER HAVING LOW RESISTANCE

[75] Inventors: Jeon-Wook Yang; Eung-Gee Oh; Byung-Sun Park; Chul-Sun Park; Kwang-Eui Pyun, all of Daejeon, Rep. of Korea

[73] Assignee: Electronics and Telecommunications Research Institute, Daejeon, Rep. of Korea

[21] Appl. No.: 675,972

[22] Filed: Jul. 5, 1996

[30] Foreign Application Priority Data

Nov. 21, 1995 [KR] Rep. of Korea ............... 95-42596

[51] Int. Cl.⁶ .................................................. H01L 21/28
[52] U.S. Cl. .................. 438/574; 438/577; 438/579; 148/DIG. 100
[58] Field of Search .................................. 437/175, 176, 437/177, 178, 179, 228 PL, 944; 148/DIG. 100; 438/574, 577, 579

[56] References Cited

U.S. PATENT DOCUMENTS

| | | | |
|---|---|---|---|
| 4,839,304 | 6/1989 | Morikawa | 437/177 |
| 4,959,326 | 9/1990 | Roman et al. | 437/175 |
| 4,965,218 | 10/1990 | Geissberger | 437/177 |
| 4,980,316 | 12/1990 | Huebner | 437/229 |
| 5,030,589 | 7/1991 | Noda | 437/177 |
| 5,032,541 | 7/1991 | Sakamoto et al. | 437/177 |
| 5,278,083 | 1/1994 | Hill | 437/31 |

FOREIGN PATENT DOCUMENTS

| | | | |
|---|---|---|---|
| 63-287021 | 11/1988 | Japan | 437/177 |
| 6-84954 | 3/1994 | Japan | 437/175 |
| 2222308 | 2/1990 | United Kingdom | 437/178 |

*Primary Examiner*—Michael Trinh
*Attorney, Agent, or Firm*—Antonelli, Terry, Stout & Kraus, LLP

[57] ABSTRACT

A method for fabricating a T-shaped gate electrode includes the steps of: forming a fine gate pattern on a semiconductor substrate; forming an insulating layer on the semiconductor substrate on which the gate pattern is formed, and forming a planarizing layer on the insulating layer to planarize the surface of the semiconductor substrate; etching the planarizing layer to expose the top of the insulating layer; isotropically etching the insulating layer to expose the gate pattern using the planarizing layer as a mask; etching the exposed gate pattern to selectively expose the semiconductor substrate; depositing a gate metal to cover the exposed substrate, the insulating layer and the planarizing layer, to form a T-shaped gate; and simultaneously removing the planarizing layer, thereby forming a T-shaped gate metal with improved productivity.

3 Claims, 4 Drawing Sheets

METHOD FOR FABRICATING T-SHAPED ELECTRODE AND METAL LAYER HAVING LOW RESISTANCE

BACKGROUND OF THE INVENTION

The present invention relates to a method for fabricating a T-shaped electrode and metal layer having a low resistance, and more particularly, to a method for fabricating a T-shaped gate electrode and metal layer having a low resistance in which the T-shaped gate electrode is formed in self-alignment using a fine photoresist pattern, and the metal layer having a low resistance is formed on a fine gate electrode in self-alignment using the method for forming the T-shaped gate electrode, thereby simplifying the fabricating process and increasing mass productivity.

For the purpose of fabricating an ultra-high speed integrated circuit using a metal semiconductor field effect transistor (MESFET), the MESFET should have many various high frequency characteristics. Generally, a MESFET formed using GaAs has a cutoff frequency over 25 GHz in a device having a gate length of below 0.5 µm. Its frequency characteristic becomes higher as the gate width is decreased. However, the reduction of the gate width decreases the cross-section area of the gate, thus deteriorating noise characteristics. Accordingly, several methods are proposed, which are for reducing the gate length and, at the same time, decreasing the gate resistance using a T-shaped gate electrode. According to the first method for forming the T-shaped gate electrode, a T-shaped resist pattern is formed by using electron-beam lithography, and then a metal is deposited thereon and lifted off. By the second method, a fine resist groove is formed through lithography, and another resist pattern having an open portion wider than the groove is formed, to form a T-shaped groove. Then, the T-shaped gate electrode is formed using the resist groove and upper resist.

According to the third method for forming the T-shaped gate electrode, a temporary gate is formed using a photoresist, a fine groove is formed by using this temporary gate and a resist pattern having a large width is formed on the groove. Then, a metal having a low resistance is deposited over the resist pattern, and then is lifted off, thereby forming the T-shaped gate electrode. The fourth method is performed in a manner that a gate is formed, a planarizing layer is formed thereon and etched to expose the gate, and then a resist pattern having a width wider than that of the gate is formed over the gate. A metal is deposited thereon and is then lifted off, thereby forming the T-shaped gate electrode.

However, the first method requires very expensive equipment for E-beam lithography and second method requires two lithographic process sequences, reducing the productivity thereof. Also, in case of the third and fourth methods, the gate electrode is easily formed due to the misalignment of the top metal layer, and requires two lithographic process sequences.

SUMMARY OF THE INVENTION

It is an object of the present invention to provide a method for fabricating a T-shaped gate electrode, which is capable of simplifying the fabrication process, thereby improving productivity.

It is another object of the present invention to provide a method for fabricating a T-shaped metal layer having a low resistance in which the metal layer having a low resistance can be formed on a fine gate pattern in self-alignment.

To accomplish the object of the present invention, there is provided a method for fabricating a T-shaped gate electrode constructed in such a manner that a gate pattern is formed with a photoresist on a semiconductor substrate, and an insulating layer is formed on the gate pattern through plasma enhanced chemical vapor deposition (PECVD) or sputtering. The insulating layer is also formed on both sides of the gate pattern, and its thickness can be optionally determined. Then, one of resist layer, polyimide layer and insulating layer different from the previously formed insulating layer is formed on the overall surface of the substrate to planarize the surface of the substrate. Here, the planarizing layer is formed with a different thickness on portions under which the gate pattern is formed, and is not formed. The planarizing layer is etched through ion milling or dry etching using a mixture of chemical gases, to selectively expose a portion of the insulating layer placed on the gate pattern. The exposed portion of the insulating layer is appropriately wet or dry etched using the remaining planarizing layer as a mask. By doing so, an undercut is formed under the remaining planarizing layer, and at the same time, the gate pattern is exposed. The gate pattern is removed to form a T-shaped groove, and the substrate is appropriately etched using the T-shaped groove. A gate metal is deposited on the substrate, and then the substrate is dipped into a solvent or etchant to etch the planarizing layer and lift off the gate metal placed on the planarizing layer. As described above, the gate pattern formed with photoresist is replaced by the gate metal, to form the T-shaped gate electrode.

According to the present invention, it is possible to form a gate pattern which is smaller and finer according to an optically formed fine pattern, and to etch this fine pattern. Also, the T-shaped gate can be formed using the gate pattern. Furthermore, the size of the wings of the can be optionally controlled by the adjustment of the thickness of the insulating layer. The present invention does not require lithography for forming the T-shape, simplifying its process.

BRIEF DESCRIPTION OF THE ATTACHED DRAWINGS

The novel features of the invention, as well as other features and advantages thereof, will best be understood by reference to the following detailed description of a particular embodiment, read in conjunction with the accompanying drawings, wherein:

FIGS. 1A to 1H are cross-sectional views showing a method for fabricating a T-shaped gate electrode according to the present invention; and FIGS. 2A to 2G are cross-sectional views showing a method for fabricating a T-shaped metal layer having a low resistance according to the present invention.

DETAILED DESCRIPTION OF PREFERRED EMBODIMENT

Figure 1A:
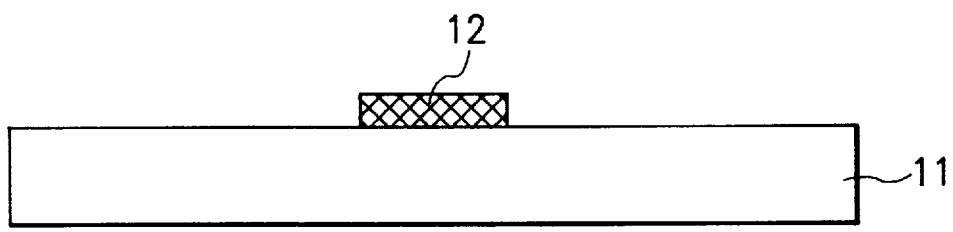

Preferred embodiments of the present invention will be explained below with reference to the accompanying drawings. A method for fabricating a T-shaped gate electrode according to the present invention will be explained below with reference to FIGS. 1A to 1H. As shown in FIG. 1A, a resist pattern 12 is formed on a semiconductor substrate 11 in which a channel layer is formed, and patterned into a fine gate pattern through lithography. Resist pattern 12 is formed with positive resist, thereby being easily formed into a width of about 0.2 µm through the lithography. Also, its width can be further reduced by etching.

Figure 1B:
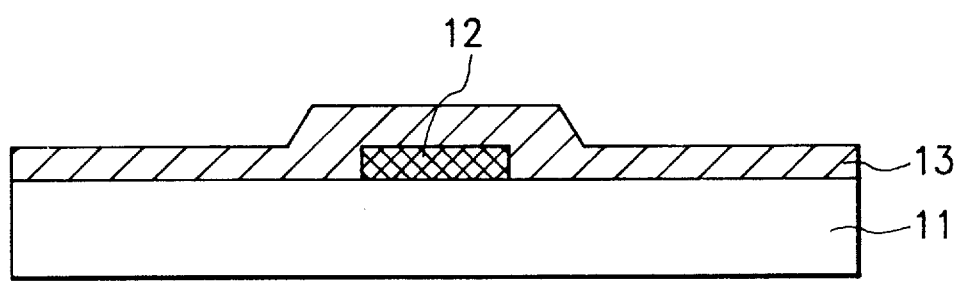

As shown in FIG. 1B, an insulating layer 13 such as $SiO_2$ or SiN layer is formed on the overall surface of the substrate through PECVD or sputtering, to be formed in a good step coverage with the sidewall thickness of d. Here, insulating layer 13 is formed at a temperature below 150° C. so as not to damage resist pattern 12. By doing so, insulating layer 13 surrounds resist pattern 12 without change of the shape of resist pattern 12.

Figure 1C:
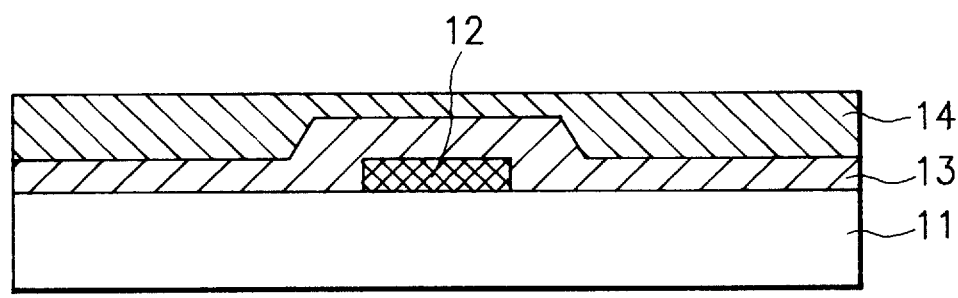
Figure 1D:
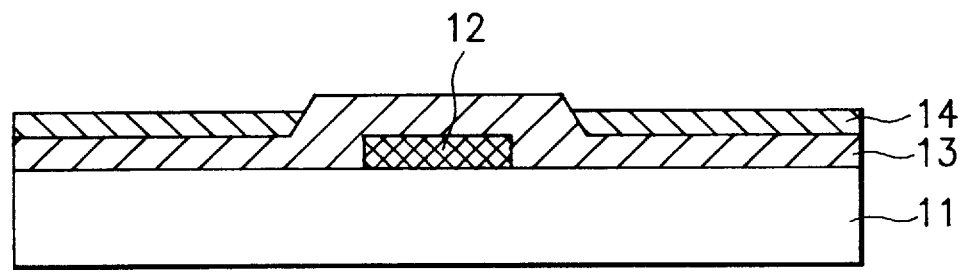

As shown in FIG. 1C, a planarizing layer 14 is formed on insulating layer 13 to planarize the surface of the substrate. A portion of planarizing layer 14 placed over resist pattern 12 is thinner than that placed on insulating layer 13 under which resist pattern 12 is not formed. Planarizing layer 13 may be formed of resist, polyimide or spin on glass (SOG). Then, as shown in FIG. 1D, the substrate is uniformly etched to selectively expose insulating layer 13. The etching is carried out through ion milling, or dry etching using a mixture of appropriate etch gases, to uniformly etch the planarizing layer.

Figure 1E:
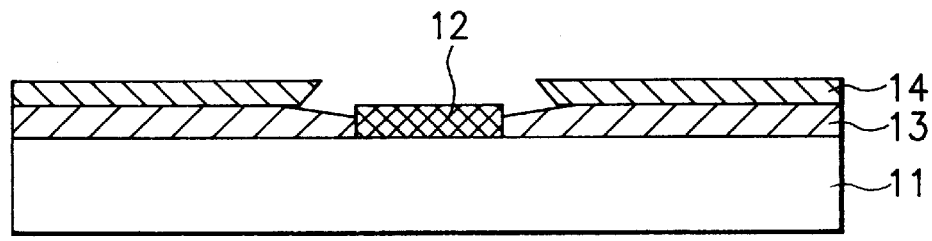

Thereafter, as shown in FIG. 1E, the exposed portion of insulating layer 13 is etched using the remaining planarizing layer 14 as a mask. Here, if insulating layer 13 is formed of $SiO_2$ or SiN, it can be etched using an etch gas containing fluorine. Also, it can be wet-etched using diluted HF solution. This etching process should be carried out under the condition of a sufficiently large etch selectivity of the insulating layer to the resist layer. Also, the insulating layer is isotropically etched to form an undercut under the remaining planarizing layer.

Figure 1F:
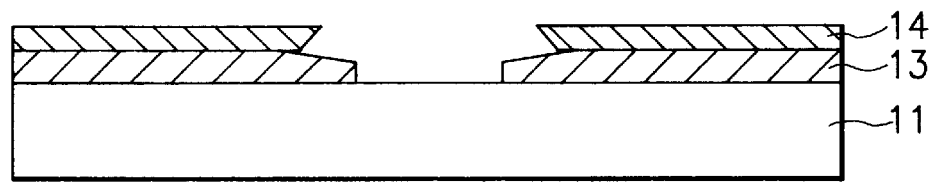

Then, as shown in FIG. 1F, the resist pattern exposed by etching of the insulating layer is selectively etched using a solution which does not etch the planarizing layer. The resist pattern 12, which is formed in a manner that the resist layer is developed and sufficiently exposed, can be dissolved by a developer when it is exposed by etching insulating layer 13. Thus, it is possible to selectively etch resist pattern 12 with ease.

Figure 1G:
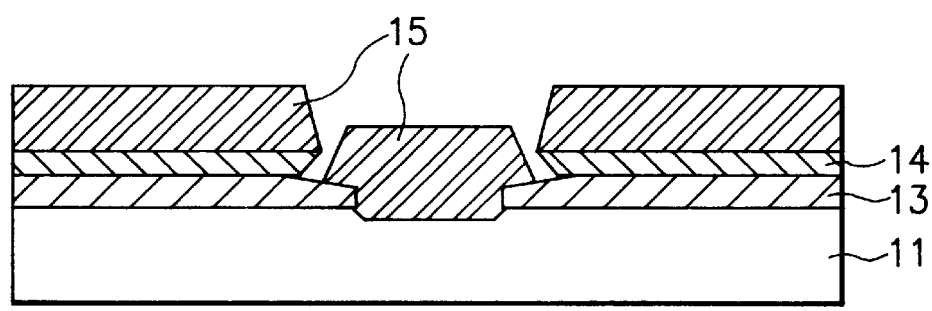
Figure 1H:
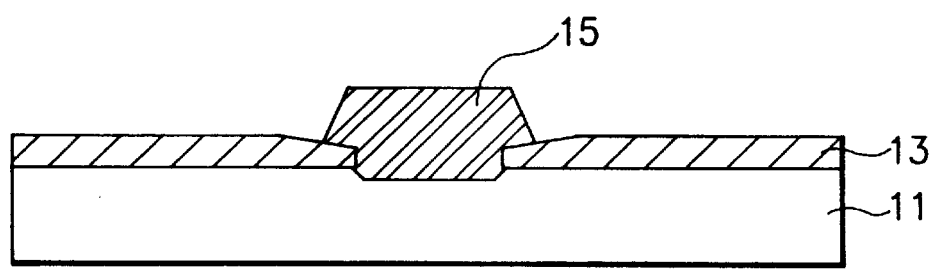

As shown in FIG. 1G, if the channel layer is exposed according to the etching of the resist pattern, the exposed channel layer is appropriately etched to be suitable for the characteristic of a semiconductor device, and then a metal 15 for forming the gate is deposited on the substrate. By doing so, metal layer 15 is formed on planarizing layer 14, substrate 11 and insulating layer 13, and does not come into contact with the side of planarizing layer 14 and undercut region. Then, as shown in FIG. 1H, if the substrate is dipped into a solvent or etchant for etching planarizing layer 14, planarizing layer 14 is etched, and at the same time, metal layer 15 placed thereon is lifted off. By doing this, a T-shaped gate electrode is formed.

As described above, since resist pattern 12 is formed having a narrow width of Lg, the gate width, which contacts the substrate, is very small. Also, it is possible to form the T-shape through one-time lithography, resulting in an increase in the process efficiency. Furthermore, the width of upper portion of the T-shape can be optionally controlled according to the adjustment of the sidewall thickness of the insulating layer.

Figure 2A:
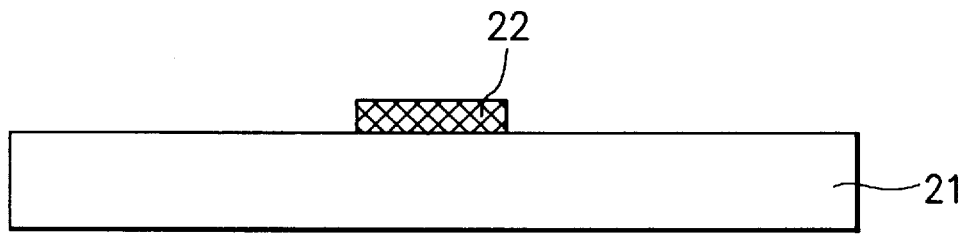

Meanwhile, a metal having a low resistance can be deposited on a gate electrode or metal line which is finely sized using the aforementioned method of the present invention. The method for fabricating the metal layer having a low resistance on the fine gate electrode or metal line will be explained below with reference to FIGS. 2A to 2G. First of all, as shown in FIG. 2A, a metal pattern 22 such as gate electrode or metal line having a fine size requiring a metal having a low resistance to be formed thereon is formed on a substrate 21. Fine metal pattern 22 may be formed in such a manner that a metal line is deposited on the substrate 21 through sputtering and patterned into a predetermined gate pattern through lithography, and then the metal layer is etched. Also, metal pattern 22 can be formed in a manner that a fine negative resist pattern is formed, a metal layer is formed thereon, and then the metal layer is lifted off. If the metal pattern is formed having a very fine size, it requires a metal layer having a low resistance to be formed thereon.

Figure 2B:
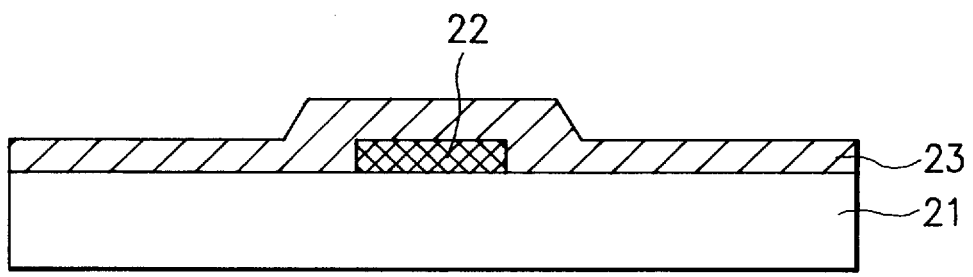

As shown in FIG. 2B, an insulating layer 23 such as $SiO_2$ or SiN layer is formed on the substrate on which gate metal 22 is formed, through PECVD or sputtering, to be formed in a sufficiently good step coverage. By doing so, insulating layer 23 is also formed with the sidewall thickness of d on both sides of gate metal 22. Accordingly, the size of the protruded portion of the substrate equals the size of insulating layer 23 placed on both sides of gate metal pattern 22 added by the size of gate metal 22.

Figure 2C:
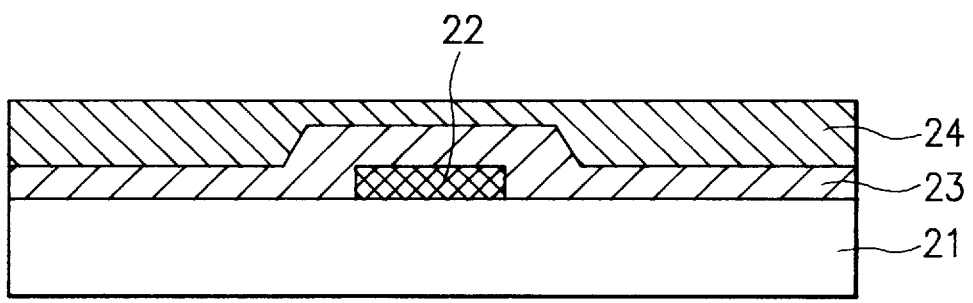
Figure 2D:
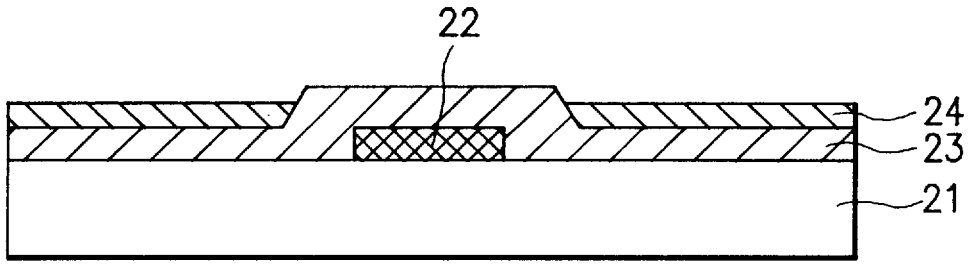

Then, as shown in FIG. 2C, a planarizing layer 24 is formed on the overall surface of the substrate. Here, a portion of planarizing layer 24 placed over gate metal 22 is thinner than that placed on insulating layer 23 under which gate metal 22 is not formed. Planarizing layer 24 may be formed of resist, polyimide or insulating material. Thereafter, as shown in FIG. 2D, planarizing layer 24 is etched to selectively expose insulating layer 23. During this etching process, the etched shape of insulating layer 23 may depend on its pre-etching shape. Accordingly, it is desirable to carry out the etching process to maintain the flat surface of the substrate.

Figure 2E:
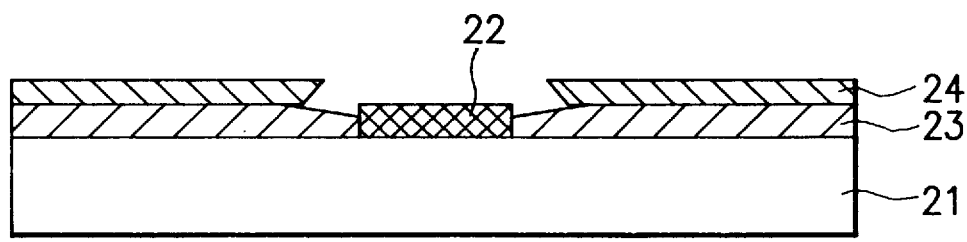

As shown in FIG. 2E, the exposed portion of insulating layer 23 is selectively etched. Here, it is required that the etching is carried out using an appropriate etching solution or etchant, not to damage metal pattern 22 placed under the exposed portion of insulating layer 23. It is desirable that the insulating layer is isotropically etched to form an undercut under the remaining planarizing layer.

Figure 2F:
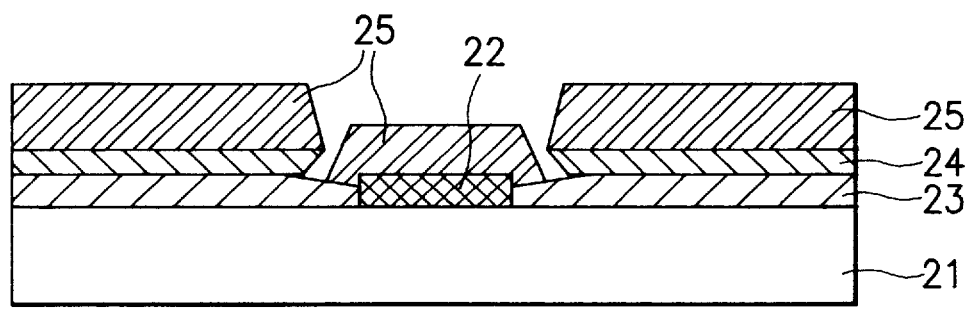
Figure 2G:
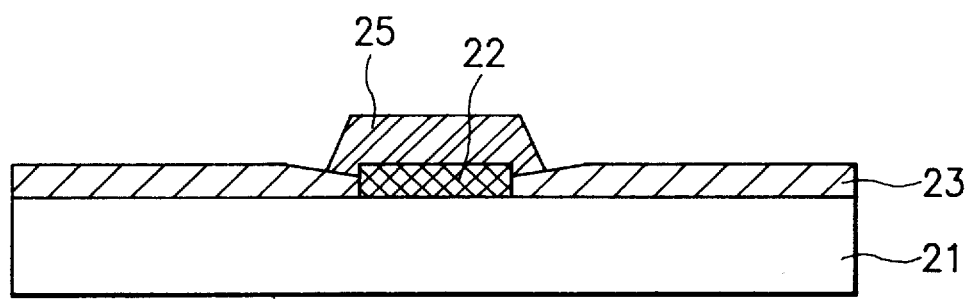

As shown in FIG. 2F, a metal 25 having a low resistance is deposited on gate metal 22 exposed by the etching of insulating layer 23, to thereby contact metal layer 25 having a low resistance with gate metal 22. Then, the substrate is dipped into a solvent or etchant for removing planarizing layer 24, to lift off metal layer 25 placed on the remaining planarizing layer 25. The width of metal layer having a low resistance formed on gate metal 22 corresponds to the width of an open portion of planarizing layer 24. It also corresponds to the size of gate metal (Lg) 22 added by the width of gate insulating layer (2d) 23 placed on both sides of gate metal 22. Accordingly, the width of metal layer 25 having a low resistance can be adjusted by controlling the deposition sidewall thickness of insulating layer 23. As described above, if the gate is formed with the metal layer 25 having a low resistance formed thereon, the gate resistance is reduced thereby remarkably improving noise characteristic. Accordingly, ultra-high speed integrated circuit having high-quality can be easily manufactured.

The present invention has the following advantages. First, the T-shaped gate electrode can be easily formed without using electron-beam lithography, thus increasing mass productivity. Secondly, since the metal layer is superposed on the gate electrode without lithographic processing, the T-shape of the gate is symmetrically formed, unlike the conventional method using the temporary gate in which T-shape may be asymmetrically formed due to the misalignment in lithography. Thirdly, because the metal is deposited on the portion opened by the etching of the insulating layer, the width of the metal layer can be optionally controlled according to the sidewall thickness of the insulating layer.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A method for fabricating a T-shaped gate electrode, comprising the steps of:

forming a fine gate pattern on a semiconductor substrate;

forming an insulating layer on said semiconductor substrate on which said gate pattern is formed, and forming a planarizing layer on said insulating layer to planarize the surface of said semiconductor substrate;

etching said planarizing layer to expose the top of said insulating layer;

isotropically etching said insulating layer to expose said gate pattern using said remaining planarizing layer as a mask;

etching said exposed gate pattern to selectively expose said semiconductor substrate;

depositing a gate metal to cover said exposed substrate, said insulating layer and said planarizing layer, to form a T-shaped gate; and removing said planarizing layer to lift off the metal deposited on said planarizing layer.

2. The method as claimed in claim 1, wherein the width of an upper part of said T-shaped gate is controlled by varying the sidewall thickness of said insulating layer on said gate pattern.

3. A method for fabricating a T-shaped metal layer having a low resistance, comprising the steps of:

forming a fine gate metal on a semiconductor substrate;

forming an insulating layer on said semiconductor substrate on which said fine gate metal is formed;

forming a planarizing layer on said insulating layer, and etching said planarizing layer to selectively expose said insulating layer;

etching the exposed portion of said insulating layer to expose said fine gate metal, and depositing a metal having a low resistance on the exposed gate metal, said insulating layer and said planarizing layer; and removing said planarizing layer to lift off the metal deposited on said planarizing layer.

* * * * *